United States Patent
Ishino et al.

(10) Patent No.: US 9,923,023 B2
(45) Date of Patent: Mar. 20, 2018

(54) IMAGE PICKUP APPARATUS AND METHOD FOR MANUFACTURING IMAGE PICKUP APPARATUS

(71) Applicant: CANON KABUSHIKI KAISHA, Tokyo (JP)

(72) Inventors: Hideaki Ishino, Fujisawa (JP); Nobuhiko Sato, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/156,880

(22) Filed: May 17, 2016

(65) Prior Publication Data
US 2016/0343761 A1   Nov. 24, 2016

(30) Foreign Application Priority Data
May 18, 2015   (JP) ................................ 2015-101336

(51) Int. Cl.
*H01L 31/062* (2012.01)
*H01L 27/146* (2006.01)

(52) U.S. Cl.
CPC .... *H01L 27/14698* (2013.01); *H01L 27/1462* (2013.01); *H01L 27/1463* (2013.01); *H01L 27/14636* (2013.01); *H01L 27/14643* (2013.01); *H01L 27/14689* (2013.01); *H01L 27/14621* (2013.01)

(58) Field of Classification Search
CPC ............. H01L 27/1462; H01L 27/1463; H01L 27/14636; H01L 27/14698; H01L 27/14643; H01L 27/14689; H01L 27/14621

USPC ......................................................... 257/292
See application file for complete search history.

(56) References Cited

U.S. PATENT DOCUMENTS

| | | | |
|---|---|---|---|
| 2009/0065828 A1* | 3/2009 | Hwang | ................ H01L 27/1463 257/292 |
| 2009/0209058 A1* | 8/2009 | Kim | ................... H01L 27/14623 438/73 |
| 2010/0308386 A1* | 12/2010 | Abe | ....................... H01L 23/544 257/292 |

(Continued)

FOREIGN PATENT DOCUMENTS

| JP | 2004-111488 A | 4/2004 |
|---|---|---|
| JP | 2005-260177 A | 9/2005 |
| JP | 2007-141938 A | 6/2007 |

(Continued)

*Primary Examiner* — Vongsavanh Sengdara
(74) *Attorney, Agent, or Firm* — Canon U.S.A.Inc., IP Division

(57) ABSTRACT

At least one of a passivation film extending from a pixel circuit region to a peripheral circuit region and a member disposed between a semiconductor layer and the passivation film in the peripheral circuit region contains hydrogen. The passivation film in the peripheral circuit region has a portion overlapping one conductive line of the plurality of conductive lines in a direction perpendicular to a main surface of the semiconductor layer, the one conductive line being closest to the passivation film among the plurality of conductive lines. The passivation film in the peripheral circuit region has a through-hole, the through-hole including a portion not overlapping the one conductive line in the direction perpendicular to the main surface of the semiconductor layer.

20 Claims, 8 Drawing Sheets

(56) References Cited

U.S. PATENT DOCUMENTS

2015/0085168 A1\* 3/2015 Watanabe ............... H01L 31/18
348/273

FOREIGN PATENT DOCUMENTS

| JP | 2008-506261 A | 2/2008 |
| JP | 2008-109153 A | 5/2008 |
| JP | 2009-59824 A | 3/2009 |
| JP | 2009-188068 A | 8/2009 |
| JP | 2009-290089 A | 12/2009 |
| JP | 2010-16128 A | 1/2010 |
| JP | 2010-16242 A | 1/2010 |
| JP | 2012-23319 A | 2/2012 |
| WO | WO07/083654 A1 | 7/2007 |

\* cited by examiner

IMAGE PICKUP APPARATUS AND METHOD FOR MANUFACTURING IMAGE PICKUP APPARATUS

BACKGROUND OF THE INVENTION

Field of the Invention

The present technique relates to an image pickup apparatus.

Description of the Related Art

Image pickup apparatuses include a monolithic semiconductor device in which a single semiconductor layer constitutes a pixel circuit region and a peripheral circuit region. Different conditions are required to improve the characteristics of the pixel circuit region and the peripheral circuit region. More specifically, the pixel circuit region requires noise reduction in the pixel circuit, and the peripheral circuit region requires improved reliability of the peripheral circuit. It is known that hydrogen termination of a dangling bond on a surface of a semiconductor layer is effective in reducing noise in the pixel circuit region. However, the presence of hydrogen in the peripheral circuit region may be responsible for low reliability of the peripheral circuit. Thus, the characteristics of the pixel circuit region and the peripheral circuit region should be simultaneously improved.

Japanese Patent Laid-Open No. 2009-188068 discloses a solid-state image pickup element that includes a pixel unit, a peripheral circuit unit, and a passivation film disposed on the pixel unit and the peripheral circuit unit, wherein the passivation film serving as a hydrogen supply source is configured to have different residual hydrogen contents on the pixel unit and the peripheral circuit unit. It is stated that such a structure can ensure the reliability of a miniaturized transistor in the peripheral circuit unit with respect to temporal changes in threshold and satisfactorily decrease dark voltage on a surface of the pixel unit. The pixel unit and peripheral circuit unit in Japanese Patent Laid-Open No. 2009-188068 correspond to the pixel circuit region and peripheral circuit region in the present specification.

In the technique described in Japanese Patent Laid-Open No. 2009-188068, hydrogen supply to a semiconductor layer in an image pickup apparatus is not fully studied. In the image pickup apparatus according to Japanese Patent Laid-Open No. 2009-188068, the passivation film can prevent hydrogen diffusing from the passivation film to the semiconductor layer from diffusing into the outside (outside the image pickup apparatus). Thus, most of the hydrogen diffusing from the passivation film to the semiconductor layer is probably supplied to the semiconductor layer. Although not described in Japanese Patent Laid-Open No. 2009-188068, in the presence of a hydrogen supply source between the passivation film and the semiconductor layer, the passivation film can prevent hydrogen from diffusing from the hydrogen supply source to the outside. Thus, most of the hydrogen diffusing from the hydrogen supply source is probably supplied to the semiconductor layer. For these reasons, different residual hydrogen contents of the passivation film in the pixel circuit region and the peripheral circuit region are not sufficient to cause a great difference in the amount of hydrogen supplied to the semiconductor layer between the pixel circuit region and the peripheral circuit region. Consequently, the characteristics of the peripheral circuit unit cannot be improved.

SUMMARY OF THE INVENTION

The present technique provides an advantageous technique for improving the characteristics of a peripheral circuit region.

According to one aspect of the present technique, a method for manufacturing an image pickup apparatus including a pixel circuit region and a peripheral circuit region includes preparing a structure and heat-treating the structure. The structure includes a semiconductor layer constituting the pixel circuit region and the peripheral circuit region, a passivation film extending from the pixel circuit region to the peripheral circuit region, a member disposed between the semiconductor layer and the passivation film in the peripheral circuit region, and a plurality of conductive lines disposed between the semiconductor layer and the passivation film. At least one of the passivation film and the member contains hydrogen. The passivation film in the peripheral circuit region has a portion overlapping one conductive line of the plurality of conductive lines in a direction perpendicular to a main surface of the semiconductor layer, the one conductive line being closest to the passivation film among the plurality of conductive lines. The passivation film in the peripheral circuit region has a through-hole, the through-hole including a portion not overlapping the one conductive line in the direction perpendicular to the main surface of the semiconductor layer.

Further features of the present invention will become apparent from the following description of exemplary embodiments with reference to the attached drawings.

DESCRIPTION OF THE EMBODIMENTS

Figure 1A:
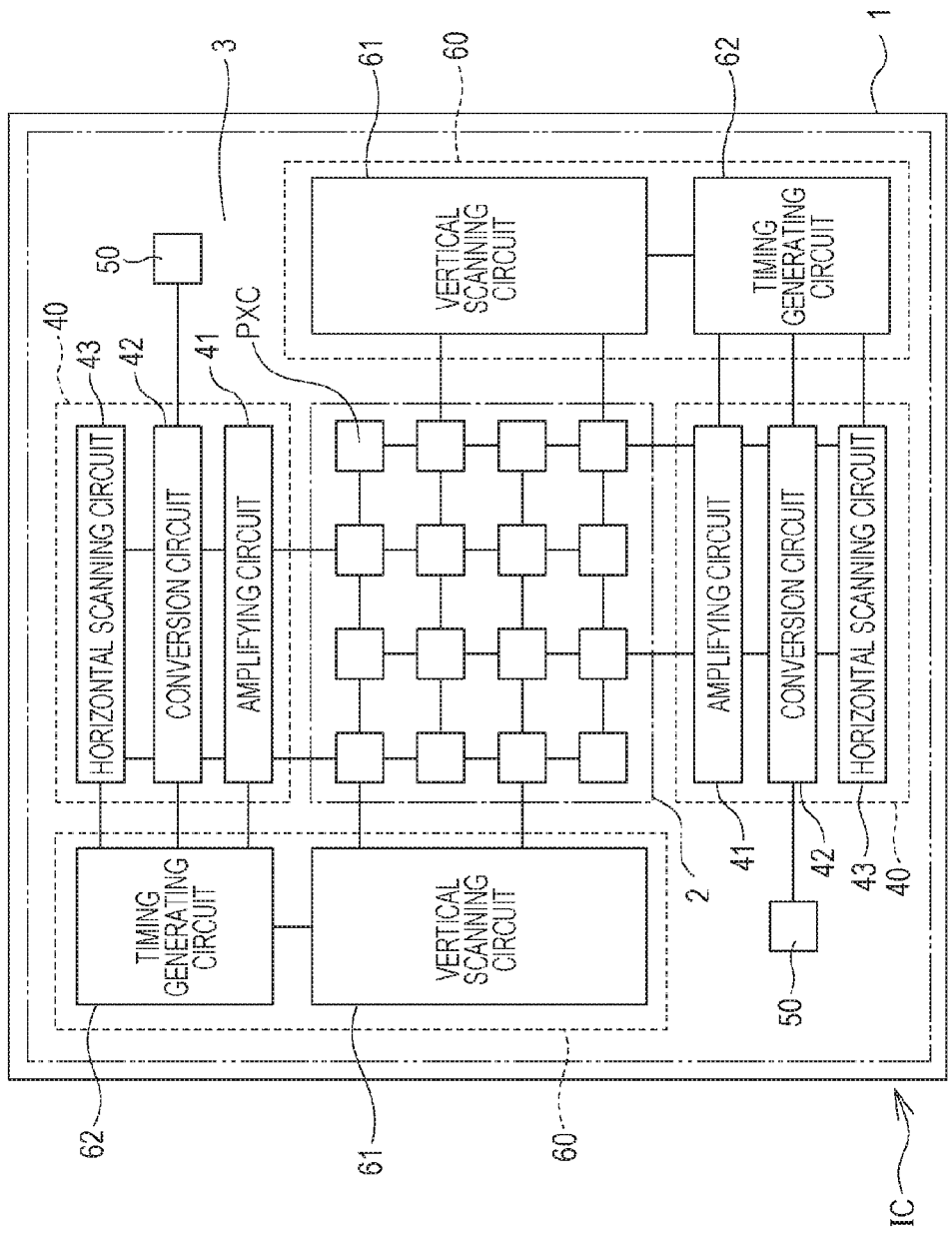
FIG. 1A is a schematic view of an image pickup apparatus according to an embodiment of the present technique.

Embodiments of the present technique will be described below with reference to the accompanying drawings. Like components are denoted by like reference numerals throughout the drawings and will not be described again.

Image Pickup Apparatus (Common Embodiment)

FIG. 1A illustrates an image pickup device IC, which constitutes the whole or part of an image pickup apparatus. The image pickup device IC is a semiconductor device including an integrated circuit, and the image pickup apparatus is a semiconductor apparatus. The semiconductor device may be a semiconductor chip manufactured by dicing a semiconductor wafer.

The image pickup device IC includes a pixel circuit region 2 and a peripheral circuit region 3 on a substrate 1. The pixel circuit region 2 includes pixel circuits PXC arranged in a matrix. The peripheral circuit region 3 includes a peripheral circuit. In FIG. 1A, the pixel circuit region 2 is a region within the dash-dot line. The pixel circuit region 2 includes at least a pixel circuit that forms an effective pixel and optionally includes a pixel circuit for reference signals and/or a pixel circuit for focus detection signals. The pixel circuit that forms an effective pixel may also serve as a pixel circuit for focus detection signals.

In FIG. 1A, the peripheral circuit region 3 is a region between the dash-dot line and the dash-dot-dot line and surrounds the pixel circuit region 2. A peripheral circuit in the peripheral circuit region 3 includes a signal processing unit 40, an output unit 50, and a drive unit 60, for example. The signal processing unit 40 processes signals from a column of the pixel circuits PXC. The signal processing unit 40 includes an amplifying circuit 41 including a plurality of column amplifiers, a conversion circuit 42 including a plurality of column AD converters, and a horizontal scanning circuit 43 for selecting an output from the conversion circuit 42 and outputting the output to the output unit 50. The output unit 50 may include an amplifying circuit. The drive unit 60 includes a vertical scanning circuit 61 for driving a row of the pixel circuits PXC and a timing generating circuit 62 for controlling the operation timing of the horizontal scanning circuit 43 and the vertical scanning circuit 61.

Figure 1B:
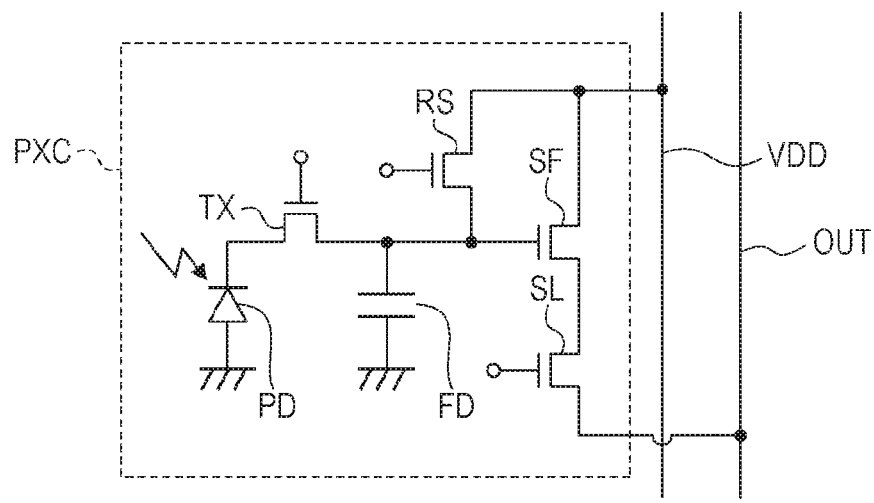
FIG. 1B is a circuit diagram of the image pickup apparatus.

FIG. 1B illustrates an example of the circuit arrangement of the pixel circuit PXC. The pixel circuit PXC includes a photoelectric conversion unit PD, a transfer gate TX, an electric carrier detecting unit FD, an amplifying transistor SF, a reset transistor RS, and a selection transistor SL. A transistor that includes the photoelectric conversion unit PD as a source, the transfer gate TX as a gate, and the electric carrier detecting unit FD as a drain is referred to as a transfer transistor. The amplifying transistor SF, the selection transistor SL, and the reset transistor RS are collectively referred to as a pixel transistor PX. All of the transfer transistor and the pixel transistor PX in the present embodiment are N-type metal insulator semiconductor (MIS) transistors. However, the pixel circuit PXC may be composed of an N-type MIS transistor and a P-type MIS transistor or may be composed of a P-type MIS transistor alone. At least one transistor in the pixel circuit PXC may be a transistor other than MIS transistors, for example, a junction field effect transistor (JFET) or a bipolar transistor. The term "MIS transistors", as used herein, are synonymous with insulated-gate field-effect transistors, and the material of gate-insulating films is not limited to pure silicon oxide. The material of gate-insulating films may be silicon nitride, silicon oxide containing nitrogen, or a low-k material, such as hafnium oxide.

The transfer gate TX transfers signal carriers from the photoelectric conversion unit PD to the electric carrier detecting unit FD. The electric carrier detecting unit FD is coupled to a gate of the amplifying transistor SF. The amplifying transistor SF is coupled to a power supply line VDD. The amplifying transistor SF is coupled to an output line OUT through the selection transistor SL. The amplifying transistor SF constitutes a source follower circuit and outputs signals to the output line OUT according to the electric potential of the electric carrier detecting unit FD. The selection transistor SL enables or disables output from the pixel circuit PXC. The reset transistor RS resets the electric potential of the electric carrier detecting unit FD to the reset voltage. In the present embodiment, the electric potential from the power supply line VDD is used as a reset voltage. The pixel circuit PXC may further include a switching unit for changing the capacity of the electric carrier detecting unit FD, in addition to the transfer gate TX, the amplifying transistor SF, and the reset transistor RS. Part of the functions of a signal-processing circuit coupled to a column of the pixel circuits PXC may be incorporated into the pixel circuits PXC.

Figure 1C:
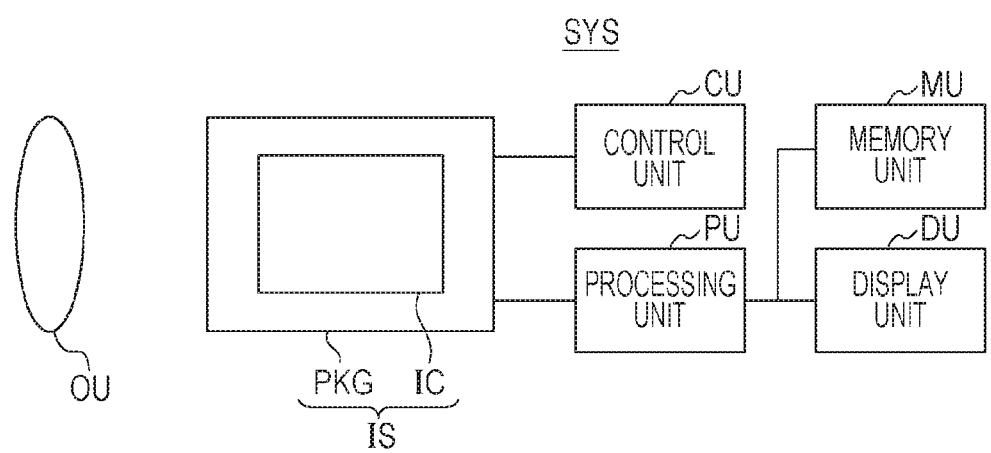
FIG. 1C is a block diagram of the image pickup apparatus.

FIG. 1C illustrates an image pickup system SYS including an image pickup apparatus IS. The image pickup system SYS is an information terminal having a camera or a photographing function. The image pickup apparatus IS may further include a package PKG for housing the image pickup device IC. The package PKG may include a base to which the image pickup device IC is fixed, a lid facing the image pickup device IC, and a connection member for coupling a terminal of the base to a terminal of the image pickup device IC. The image pickup apparatus IS may include a plurality of the image pickup devices IC in the package PKG. The image pickup apparatus IS may include another semiconductor device IC disposed on the image pickup device IC in the package PKG.

The image pickup system SYS may include an optical system OU for focusing on the image pickup apparatus IS.

The image pickup system SYS may include at least one of a control unit CU, a processing unit PU, a display unit DU, and a memory unit MU. The control unit CU controls the image pickup apparatus IS. The processing unit PU processes signals sent from the image pickup apparatus IS. The display unit DU displays images sent from the image pickup apparatus IS. The memory unit MU stores images sent from the image pickup apparatus IS.

Image Pickup Apparatus (First Embodiment)

Figure 2:
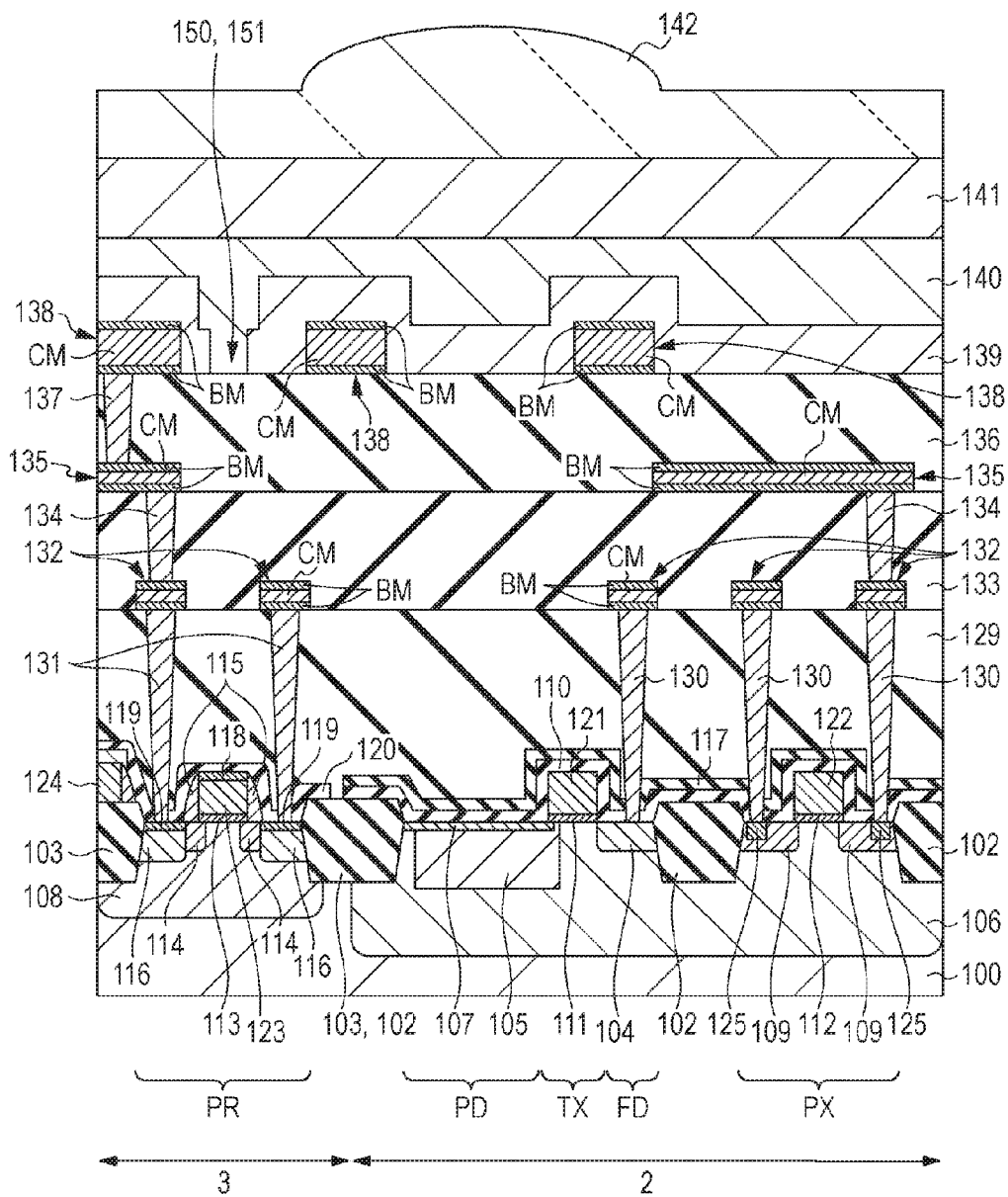
FIG. 2 is a schematic view of an image pickup apparatus.

With respect to an image pickup apparatus IS according to a first embodiment, FIG. 2 illustrates a partial section structure of one pixel circuit PXC in the pixel circuit region 2 and a partial section structure of a peripheral circuit in the peripheral circuit region 3 illustrated in FIG. 1A.

The image pickup apparatus IS includes a semiconductor layer 100, which constitutes the pixel circuit region 2 and the peripheral circuit region 3. Typically, the semiconductor layer 100 is a single-crystal silicon layer. The semiconductor layer 100 may be an epitaxial layer on the substrate 1, may be an impurity layer in bulk silicon, or may be a semiconductor layer on the substrate 1 with an interlayer insulating film interposed therebetween.

In the pixel circuit region 2, an element portion of the semiconductor layer 100 is defined by an element isolation portion 102 formed of an insulator. The element portion may also be referred to as an active region, and the element isolation portion may also be referred to as a field region. In the peripheral circuit region 3, an element portion of the semiconductor layer 100 is defined by an element isolation portion 103 formed of an insulator. The element isolation portions 102 and 103 formed of an insulator may have a local oxidation of silicon (LOCOS) structure or a shallow trench isolation (STI) structure. In the present embodiment, the insulators of the element isolation portions 102 and 103 may be a member containing hydrogen.

The photoelectric conversion unit PD in FIG. 1B corresponds to a photodiode composed of an n-type impurity region 105 and a p-type impurity region 106 in FIG. 2. The impurity region 105 functions as an accumulation region in which signal carriers accumulate. The photodiode has an embedded structure in which a p-type impurity region 107 is disposed between the impurity region 105 and a surface of the semiconductor layer 100.

A conductivity type in which electric carriers treated as signal carriers in the pixel circuit are majority carriers is hereinafter referred to as a first conductivity type, and a conductivity type in which electric carriers treated as signal carriers are minority carriers is hereinafter referred to as a second conductivity type. In the case that signal carriers are electrons, the n-type is the first conductivity type, and the p-type is the second conductivity type. In the case that signal carriers are positive holes, the p-type is the first conductivity type, and the n-type is the second conductivity type.

The p-type impurity region 106 functions as a well region. The impurity region 106 may be composed of a plurality of impurity regions having different p-type impurity concentrations. A first element portion including the impurity region 105 of the photoelectric conversion unit PD includes a gate electrode 121 and an impurity region 104. The gate electrode 121 constitutes the transfer gate TX. The impurity region 104 functions as a floating diffusion region of the electric carrier detecting unit FD. A second element portion separated from the first element portion by the element isolation portion 102 includes a gate electrode 122 of the pixel transistor PX, an impurity region 109 constituting a source/drain, and an impurity region 125 coupled to a contact plug 130.

The photoelectric conversion unit PD, the transfer gate TX, and the electric carrier detecting unit FD are covered with a silicon nitride layer 110. The silicon nitride layer 110 also covers the pixel transistor PX, more specifically, the amplifying transistor SF. If the silicon nitride layer 110 restricts hydrogen supply from the outside, hydrogen supply to the photoelectric conversion unit PD and the amplifying transistor SF is also restricted. This can increase dark current in the photoelectric conversion unit PD, the transfer gate TX, and the electric carrier detecting unit FD, and increase random noise in the amplifying transistor SF.

A MIS transistor in the peripheral circuit is referred to as a peripheral transistor PR. In order to achieve high withstand voltage in the pixel circuit and high speed in the peripheral circuit, a gate-insulating film 113 of the peripheral transistor PR can have a smaller thickness than a gate-insulating film 111 of the transfer gate TX and a gate-insulating film 112 of the pixel transistor PX in the pixel circuit. For example, when the pixel circuit has a driving voltage of 3.3 V, the gate-insulating films 111 and 112 of the transfer gate TX and the pixel transistor PX have an equivalent oxide thickness (EOT) of approximately 80 angstroms on a silicon oxide basis. In contrast, when the peripheral circuit has a driving voltage of 1.3 V, the gate-insulating film of the peripheral transistor PR has an equivalent oxide thickness (EOT) of 35 angstroms or less on a silicon oxide basis. When the gate-insulating film 113 of the MIS transistor in the peripheral circuit has a small thickness, boron contained in a gate electrode 123 in the peripheral circuit region 3 diffuses into the semiconductor layer 100 through the gate-insulating film 113. This causes a change in the threshold voltage of the P-type MIS (PMIS) transistor and a variation in the thresholds of a plurality of PMIS transistors. In order to avoid this problem, a silicon oxide film doped with nitrogen can be used as a gate-insulating film. In general, use of a silicon oxide film doped with nitrogen can reduce changes or variations in the threshold of the PMIS transistor but increase negative bias temperature instability (NBTI). This reduces the reliability of the peripheral transistor PR. In order to improve the reliability of the peripheral transistor PR, the amount of hydrogen supplied to the peripheral transistor PR can be decreased.

A passivation film 139 extending from the pixel circuit region 2 to the peripheral circuit region 3 is disposed over the semiconductor layer 100. The passivation film 139 is configured to have lower hydrogen permeability than a virtual silicon oxide film having the same thickness. In other words, the passivation film 139 is a hydrogen shielding member, which restricts hydrogen permeation. The material of the passivation film 139 that restricts hydrogen permeation is typically a compound composed of silicon and at least one of nitrogen and carbon. More typically, the passivation film 139 is a monolayer or multilayer film that includes at least one of a silicon nitride layer and a silicon oxynitride layer. For example, the passivation film 139 may be a multilayer film that includes a silicon oxynitride layer, a silicon nitride layer, and a silicon oxynitride layer stacked in this order over the semiconductor layer 100. The silicon nitride layer can be thicker than the silicon oxynitride layers. The silicon oxynitride layers at the top and bottom of the silicon nitride layer can function as antireflection layers for the top and bottom layers of the passivation film 139. The passivation film 139 has a hydrogen discharging hole 150 in the peripheral circuit region 3. Hydrogen between the passivation film 139 and the semiconductor layer 100 is discharged through the hydrogen discharging hole 150. Although described in detail later, the hydrogen discharging hole 150 is a through-hole in the passivation film 139. The passivation film 139 in the pixel circuit region 2 is configured to have higher area occupancy than the passivation film 139 in the peripheral circuit region 3. Although the passivation film 139 in the pixel circuit region 2 can also have an opening or through-hole, the passivation film 139 can entirely cover the pixel circuit region 2, that is, the passivation film 139 in the pixel circuit region 2 can have an area occupancy of 100%. The passivation films 139 in the pixel circuit region 2 and the peripheral circuit region 3 may have different layers. For example, the passivation film 139 in the pixel circuit region 2 may have a layered structure composed of silicon oxynitride layers with a silicon nitride layer interposed therebetween, and the passivation film 139 in the peripheral circuit region 3 may have a monolayer structure of a silicon nitride layer or a silicon oxynitride layer.

The passivation film 139 may contain hydrogen. In other words, the passivation film 139 may be a hydrogen-containing member. When the passivation film 139 includes both a silicon nitride layer and a silicon oxynitride layer, the silicon nitride layer can have a higher hydrogen concentration than the silicon oxynitride layer.

A planarizing film 140, a color filter 141, and a microlens 142 are disposed on the passivation film 139. The color filter 141 and the microlens 142 may be disposed on the semiconductor layer 100 opposite the passivation film 139 to provide a backside illuminated image pickup apparatus.

A multilayer wiring structure is disposed between the semiconductor layer 100 and the passivation film 139. The multilayer wiring structure includes conductive lines 132, 135, and 138, plugs 130, 131, 134, and 137, and interlayer insulating films 129, 133, and 136.

The conductive lines 132, 135, and 138 in the multilayer wiring structure have different distances from the semiconductor layer 100. Each of the conductive lines 132, 135, and 138 includes a plurality of wiring patterns having substantially the same distance from the semiconductor layer 100.

Of the conductive lines 132, 135, and 138 between the semiconductor layer 100 and the passivation film 139, the conductive line 138 is closest to the passivation film 139 (hereinafter referred to as a closest conductive line 138). Of the conductive lines on the semiconductor layer 100, the closest conductive line 138 may be or may not be most distant from the semiconductor layer 100 (an uppermost conductive line). When the closest conductive line is not the uppermost conductive line, another conductive line is disposed above the passivation film 139. The closest conductive line 138 constitutes a conductive line of an electric circuit at least in the peripheral circuit region 3. The closest conductive line 138 in the pixel circuit region 2 may be used as a grid-like light shield for defining a light transmitting portion of an effective pixel. The closest conductive line 138 may also be used as a light shield for shading the photoelectric conversion unit in a light shielded pixel in the pixel circuit region 2. The closest conductive line 138 in the peripheral circuit region 3 may be used as a pad electrode for inputting or outputting electric signals to or from the outside. The conductive lines 132, 135, and 138 are aluminum conductive lines including a conductive member CM and a barrier metal member BM. The conductive member CM is composed of an aluminum layer. The barrier metal member BM is composed of a titanium layer and/or a titanium nitride layer. The conductive lines 132, 135, and 138 may also be a copper conductive line including a conductive member composed of a copper layer and a barrier metal member composed of a tantalum layer and/or a tantalum nitride layer.

A layer of the closest conductive line 138 closest to the passivation film 139 is a titanium nitride layer or titanium layer of the barrier metal member BM. A typical aluminum conductive line is composed of titanium layer/titanium nitride layer/aluminum layer/titanium layer/titanium nitride layer in this order from the side of the semiconductor layer 100. The aluminum layer is composed mainly of aluminum and may be formed of pure aluminum or an aluminum alloy containing a minute amount of auxiliary component, such as copper. The titanium layer in the barrier metal member BM of the conductive lines above the semiconductor layer 100 occludes hydrogen and may therefore be a hydrogen-containing member. The titanium nitride layer in the barrier metal member BM of the conductive lines 132, 135, and 138 restricts hydrogen diffusion and may therefore be a hydrogen-shielding member.

The plugs 130, 131, 134, and 137 include a tungsten conductive member and a barrier metal member, which is composed of a titanium layer and/or a titanium nitride layer functioning as a barrier metal. The conductive lines and the plugs may be integrated so as to have a dual damascene structure including a conductive member composed of a copper layer and a barrier metal member composed of a tantalum layer and/or a tantalum nitride layer.

The interlayer insulating film 129 is disposed between the conductive line 132 and the semiconductor layer 100 in the pixel circuit region 2 and the peripheral circuit region 3. The interlayer insulating film 133 is disposed between the conductive line 132 and the conductive line 135. The plug 134 penetrates the interlayer insulating film 133. The interlayer insulating film 136 is disposed between the conductive line 135 and the conductive line 138. The plug 137 penetrates the interlayer insulating film 136. The interlayer insulating films 129, 133, and 136 are monolayer or multilayer films including a silicon oxide layer. The interlayer insulating films 129, 133, and 136 may be a multilayer film of a plurality of silicon oxide layers formed by different methods, containing different impurities, or having different film densities or refractive indices. The interlayer insulating films 129, 133, and 136 extend from the pixel circuit region 2 to the peripheral circuit region 3.

The interlayer insulating films 129, 133, and 136 may include a diffusion-barrier layer for a metal in the conductive lines and an etch-stop layer for use in the formation of the conductive lines. The interlayer insulating films 133 and 136 may be a hydrogen-containing member. The interlayer insulating film 129 may be a borosilicate glass (BSG) layer, a phosphosilicate glass (PSG) layer, or a boron-phosphosilicate glass (BPSG) layer. The BSG layer, PSG layer, and BPSG layer may be a hydrogen shielding member, which restricts hydrogen diffusion. When copper conductive lines are used, a silicon carbide layer or a silicon nitride layer is used as a diffusion-barrier layer. The silicon carbide layer or silicon nitride layer may also be a hydrogen shielding member, which restricts hydrogen diffusion.

The pixel circuit region 2 includes the silicon nitride layer 110 between the interlayer insulating film 129 and the element isolation portion 102. The peripheral circuit region 3 includes a silicon nitride layer 120 between the interlayer insulating film 129 and the element isolation portion 103. The plug 130 penetrates the silicon nitride layer 110, and the plug 131 penetrates the silicon nitride layer 120. The silicon nitride layers 110 and 120 may also be a hydrogen shielding member, which restricts hydrogen diffusion.

Figure 3A:
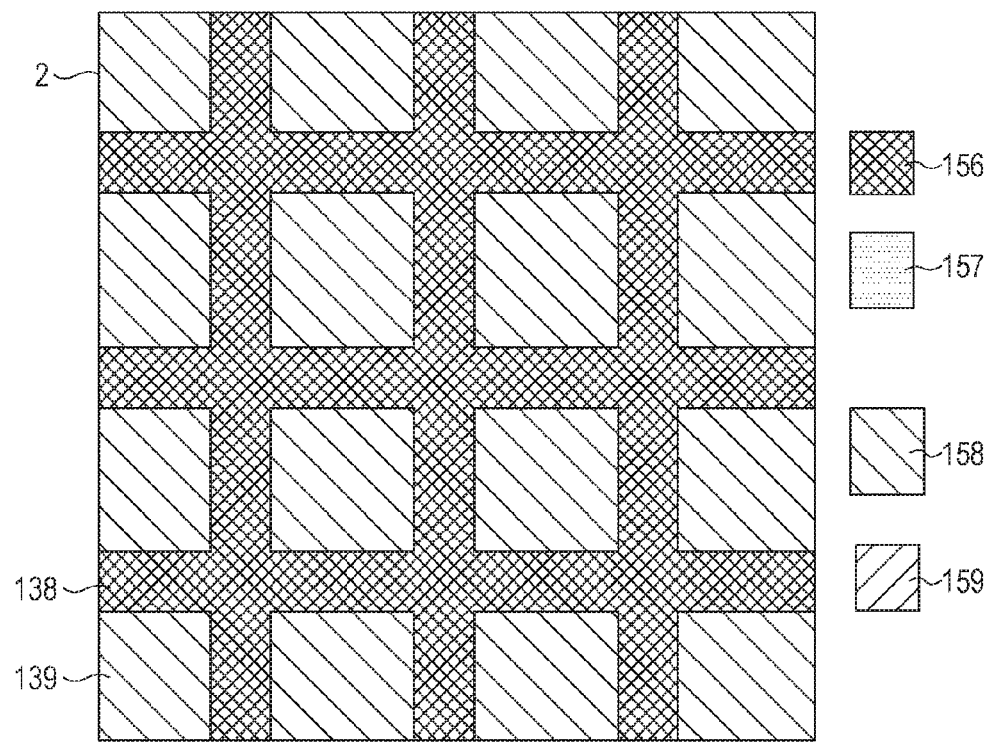
FIGS. 3A and 3B are schematic views of an image pickup apparatus.
Figure 3B:
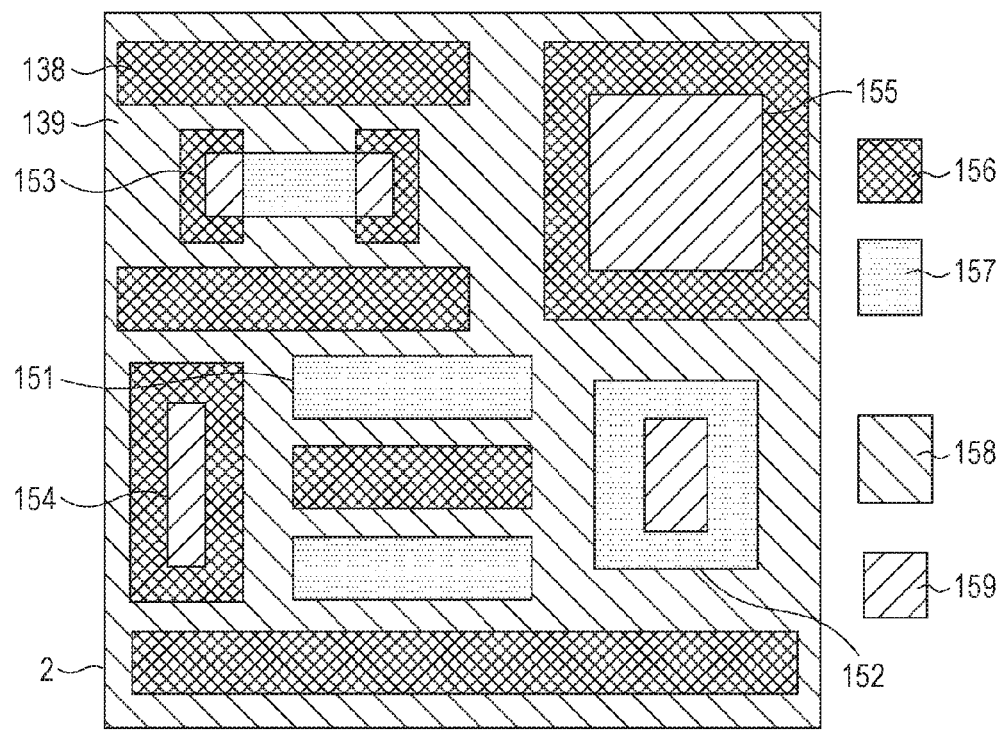

The hydrogen discharging hole 150 will be described in detail below. FIGS. 3A and 3B illustrate an overlap between the passivation film 139 and the closest conductive line 138 in a direction perpendicular to (in a direction normal to) a main surface of the semiconductor layer 100. The main surface out of two surfaces (front and back surfaces) of the semiconductor layer 100 is a surface on which the passivation film 139, the conductive line structure, the transistors, and the element isolation portions 102 and 103 are disposed.

FIG. 3A illustrates an overlap in the pixel circuit region 2, and FIG. 3B illustrates an overlap in the peripheral circuit region 3. As illustrated in FIG. 3B, the passivation film 139 includes at least one of a first type through-hole 151, a second type through-hole 152, a third type through-hole 153, and a fourth type through-hole 154 in the peripheral circuit region 3. The passivation film 139 may further include a pad opening 155. The through-holes 151, 152, 153, and 154 correspond to the hydrogen discharging hole 150 in FIG. 2. The through-holes 151, 152, 153, and 154 and the pad opening 155 do not have the passivation film 139. FIGS. 3A and 3B illustrate a first portion 156 in which the passivation film 139 and the closest conductive line 138 overlap. FIG. 3B illustrates a second portion 157 in which at least one of the through-holes 151, 152, and 153 does not overlap the closest conductive line 138. The second portion 157 does not include the passivation film 139 nor the closest conductive line 138. FIG. 3B illustrates a third portion 158 of the passivation film 139 that does not overlap the closest conductive line 138 and a fourth portion 159 of the closest conductive line 138 that does not overlap the passivation film 139. The pattern of the closest conductive line 138 is formed by the first portion 156 and the fourth portion 159. The pattern of the passivation film 139 is formed by the first portion 156 and the third portion 158.

As illustrated in FIG. 3A, the passivation film 139 is disposed on the entire pixel circuit region 2, and the entire wiring pattern of the closest conductive line 138 in the pixel circuit region 2 overlaps the passivation film 139. As illustrated in FIG. 3B, the passivation film 139 in the peripheral circuit region 3 includes the first portion 156 that overlaps the closest conductive line 138. As illustrated in FIG. 3B, the first type through-hole 151 constitutes the second portion 157 that does not overlap the closest conductive line 138. The second type through-hole 152 and the third type through-hole 153 partly include the second portion 157 that does not overlap the closest conductive line 138 and partly include the fourth portion 159 that overlaps the closest conductive line 138. An edge of the second type through-hole 152 does not overlap the closest conductive line 138, and an edge of third type through-hole 153 overlaps the closest conductive line 138. The entire fourth type through-hole 154 constitutes the fourth portion 159 that overlaps the closest conductive line 138. The pad opening 155 includes the fourth portion 159 that overlaps the closest conductive line 138. A portion of the closest conductive line 138 overlapping the pad opening 155 is used as a pad electrode. Although the entire pad opening 155 can constitute the fourth portion 159 that overlaps the closest conductive line 138, the pad opening 155 may include the second portion 157 that does not overlap the closest conductive line 138.

In the present embodiment, during manufacture or use of the image pickup apparatus IS, hydrogen between the passivation film 158 and the semiconductor layer 100 can be discharged through the hydrogen discharging hole 150 in the peripheral circuit region 3. This can reduce the amount of hydrogen supplied to the peripheral transistor PR in the peripheral circuit region 3 and improve the reliability of the peripheral transistor PR. Hydrogen between the passivation film 158 and the semiconductor layer 100 is emitted from the hydrogen-containing member. The hydrogen-containing member may be the passivation film 139 or may be disposed between the passivation film 158 and the semiconductor layer 100. When the hydrogen-containing member between the passivation film 158 and the semiconductor layer 100 has a higher hydrogen supply capacity than the passivation film 158, the semiconductor layer 100 is mainly supplied with hydrogen from the hydrogen-containing member. This enhances the effect of the hydrogen discharging hole 150.

The hydrogen discharging hole 150 may be disposed anywhere in the peripheral circuit region 3. In order to reduce the NBTI of the peripheral transistor PR, the hydrogen discharging hole 150 can be disposed in such a manner as to overlap the P-type MIS transistor in which boron is introduced into the gate electrode. The hydrogen discharging hole 150 can be disposed in such a manner as to overlap the signal processing unit 40 and/or the output unit 50 illustrated in FIG. 1. More specifically, the hydrogen discharging hole 150 can be disposed in such a manner as to overlap the amplifying circuit 41 or the conversion circuit 42 of the signal processing unit 40. When the output unit 50 includes an amplifying circuit, the hydrogen discharging hole 150 can be disposed in such a manner as to overlap the amplifying circuit.

The hydrogen discharging hole 150 includes the second portion 157 that does not overlap the closest conductive line 138, in order to prevent hydrogen discharge from being blocked by the closest conductive line 138. In particular, when the closest conductive line 138 includes a hydrogen shielding member, such as a titanium nitride layer, the closest conductive line 138 has a significant influence on hydrogen discharge. Furthermore, when a layer of the closest conductive line 138 closest to the passivation film 139 is a hydrogen shielding member, such as a titanium nitride layer, the closest conductive line 138 has a more significant influence on hydrogen discharge. The fourth type through-hole 154 includes the fourth portion 159 that entirely overlaps the closest conductive line 138. The fourth type through-hole 154 is an effective hydrogen discharging hole when the passivation film 139 is separated from the closest conductive line 138. For example, if a silicon oxide film is disposed between the passivation film 139 and the closest conductive line 138, even when the through-hole 154 entirely overlaps the closest conductive line 138, hydrogen can be discharged from the through-hole 154 through the silicon oxide film. In contrast, if the closest conductive line 138 including a hydrogen shielding member is in contact with the passivation film 139, when the through-hole in the passivation film 139 entirely overlaps the closest conductive line 138, the through-hole cannot function as a hydrogen discharging hole. This is because the through-hole is substantially blocked by the hydrogen shielding member.

The hydrogen discharging hole 150 in the passivation film 139 may impair the performance (such as moisture resistance) of the passivation film 139 as a protective film. However, the first portion 156 of the passivation film 139 that overlaps the closest conductive line 138 can effectively suppress degradation of the closest conductive line 138. In the image pickup apparatus IS illustrated in FIG. 1, moisture intrusion from the atmosphere can be greatly reduced by improving the air tightness of the package PKG.

The amount of hydrogen supplied to the semiconductor layer 100 can be estimated from the concentration of hydrogen in the element isolation portions 102 and 103 near the semiconductor layer 100. The hydrogen discharging hole 150 in the passivation film 139 can make the hydrogen concentration CB of the element isolation portion 103 in the peripheral circuit region 3 lower than the hydrogen concentration CA of the element isolation portion 102 in the pixel circuit region 2 (CB<CA). For example, the hydrogen concentration CB of the element isolation portion 103 in the peripheral circuit region 3 can be less than or equal to half of the hydrogen concentration CA of the element isolation portion 102 in the pixel circuit region 2 (CB≤CA/2). Although the hydrogen concentration depends on the total area or heat-treatment conditions of the hydrogen discharging hole 150, when the element isolation portion 102 has an area occupancy of approximately 0.4, the concentration of hydrogen in the pixel circuit region 2 can be $4 \times 10^{19}$ (atoms/cm$^3$) or more. In contrast, the concentration of hydrogen in the peripheral circuit region 3 can be $2 \times 10^{19}$ (atoms/cm$^3$) or less. Furthermore, in combination with a treatment or structure to increase the amount of hydrogen supplied in the pixel circuit region 2, the hydrogen concentration CB of the element isolation portion 103 in the peripheral circuit region 3 can be one-tenth or less of the hydrogen concentration CA of the element isolation portion 102 in the pixel circuit region 2 (CB≤CA/10). In a structure for increasing the amount of hydrogen supplied in the pixel circuit region 2, for example, the cubic content of a hydrogen-containing member is higher in the pixel circuit region 2 than in the peripheral circuit region 3.

The concentration of hydrogen in the insulators of the element isolation portions 102 and 103 can be determined by secondary ion mass spectrometry (SIMS). The SIMS analysis of the element isolation portions 102 and 103 can be performed on a surface (back surface) of the semiconductor layer 100 opposite a surface (front surface) on which the element isolation portions 102 and 103 and the transistors are disposed. The SIMS analysis may be performed on the front surface of the semiconductor layer 100 after the layers other than the semiconductor layer 100 and other than the element isolation portions 102 and 103 are removed. A method for determining the hydrogen concentrations CA and CB will be described below.

Figure 4A:
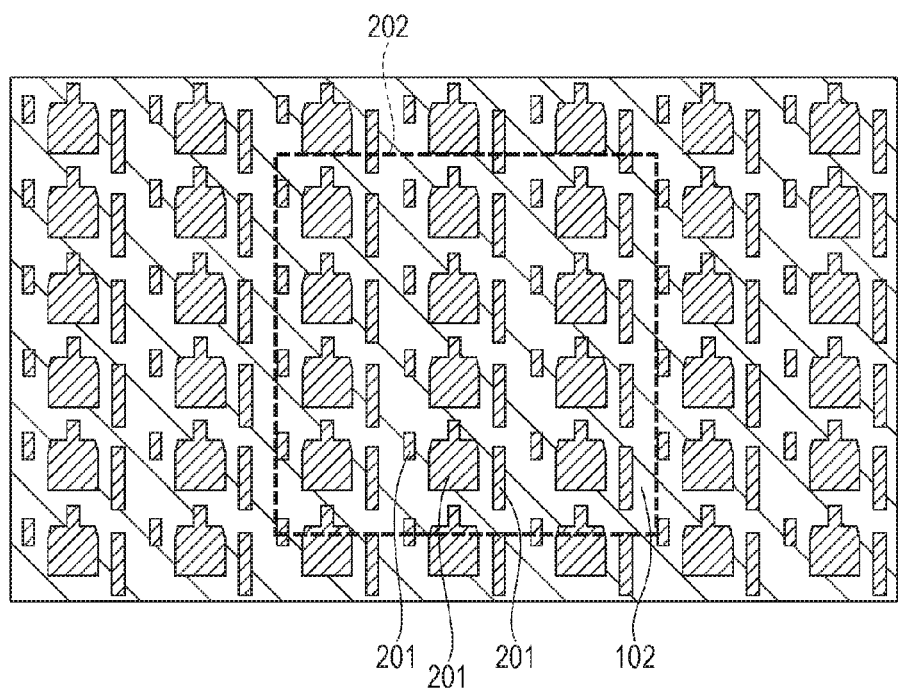
FIGS. 4A and 4B are schematic views of an image pickup apparatus.

FIG. 4A illustrates an arrangement of element portions 201 and an element isolation portion 102 in the pixel circuit region 2 and also illustrates a SIMS analysis region 202. The analysis region 202 is a rectangle having a side length of tens of micrometers or a circle having a diameter of tens of micrometers. The analysis region 202 has an area SC (cm$^2$). The pixel circuit region 2 includes an array of pixel circuit patterns each having a size of several micrometers. Thus, the analysis region 202 includes several to tens of pixel circuit patterns. The hydrogen density DA (atoms/cm$^3$) of the analysis region 202 is determined by SIMS. Because the pixel circuit region 2 includes an array of pixel circuit patterns, any area in the analysis region 202 has almost the same hydrogen density DA as measured by SIMS. The element portions 201 are made of silicon having a low hydrogen solubility limit, whereas the element isolation portion 102 is made of an insulator, such as silicon oxide, having a high hydrogen solubility limit. Thus, the element portions 201 have a negligible hydrogen concentration compared with the element isolation portion 102. Since the analysis region 202 having the hydrogen density DA includes the element portions 201 and the element isolation portion 102, the hydrogen density DA determined by SIMS is the average hydrogen density of the SIMS analysis region including the element portions 201 and the element isolation portion 102. Since the element portions 201 have a negligible hydrogen concentration compared with the element isolation portion 102, the hydrogen density DA determined by SIMS is not comparable to the hydrogen concentration CA of the element isolation portion 102. This is because the element isolation portion 102 does not spread over the entire analysis region, but the element portions 201 and the element isolation portion 102 coexist in the analysis region. Thus, the actual hydrogen concentration CA of the element isolation portion 102 is determined as described below. First, the area occupancy OA of the element isolation portion 102 in the analysis region 202 is determined. The area occupancy can be calculated from the computer-aided design (CAD) data used for the layout design of the element isolation portion 102. The area occupancy OA of the element isolation portion 102 is calculated by dividing the total area SA (cm$^2$) of the element isolation portion 102 in a plan view of the analysis region 202 by the area SC of the analysis region 202 (OA=SA/SC). The hydrogen concentration CA of the insulator of the element isolation portion 102 is calculated by dividing the hydrogen density DA of the analysis region 202 by the area occupancy OA of the element isolation portion 102 (CA=DA/OA). The area occupancy OA is more than 0 and less than 1 and typically ranges from approximately 0.2 to 0.6. In the image pickup apparatus IS, in order to increase the light receiving area of the photoelectric conversion unit PD, the element portions 201 in the pixel circuit region 2 are larger than the element isolation portion 102, and the area occupancy OA of the element isolation portion 102 may be 0.5 or less.

Figure 4B:
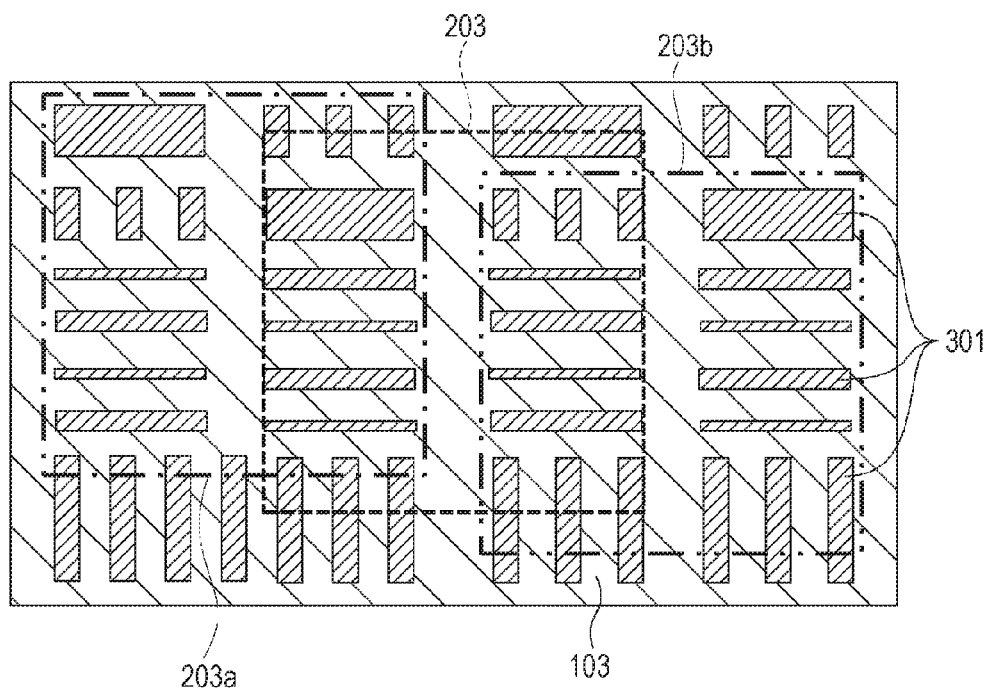

FIG. 4B illustrates an arrangement of element portions 301 and an element isolation portion 103 in the peripheral circuit region 3 and also illustrates a SIMS analysis region 203. The peripheral circuit region 3 is analyzed by SIMS in the same manner as described above. Unlike the pixel circuit region 2, the peripheral circuit region 3 has a random circuit pattern. Thus, the area occupancy of the element isolation portion 103 in the analysis region 203 varies in different SIMS analysis areas. Thus, the area occupancy of each element isolation portion 103 in regions 203a and 203b in the peripheral circuit region 3 is determined. The outlines of the regions 203a and 203b are geometrically identical with the outline of the analysis region 202 in the pixel circuit region 2. The average area occupancy OB of the element isolation portions 103 are calculated from the area occupancies thus determined. The area occupancies can be calculated from the CAD data used for the layout design of the element isolation portion 103. The area occupancy OB is more than 0 and less than 1 and typically ranges from approximately 0.4 to 0.8. A region that has the average area occupancy OB and is geometrically identical with the analysis region 202 in the pixel circuit region 2 is selected as the analysis region 203 in the peripheral circuit region 3. The analysis region 203 can overlap the hydrogen discharging hole 150. The hydrogen density DB (atoms/cm$^3$) of the analysis region 203 is determined by SIMS. The hydrogen concentration CB of the insulator of the element isolation portion 103 is calculated by dividing the hydrogen density DB of the analysis region 203 by the area occupancy OB of the element isolation portion 103 (CB=DB/OB).

In the image pickup apparatus IS, in order to increase the light receiving area of the photoelectric conversion unit PD, the element portions 201 in the pixel circuit region 2 are larger than the element isolation portion 102. Thus, the area occupancy OA of the element isolation portion 102 in the pixel circuit region 2 is lower than the area occupancy OB of the element isolation portion 103 in the peripheral circuit region 3 (OA<OB). The amount of hydrogen per unit volume supplied from the element isolation portion can be higher in the pixel circuit region 2 than in the peripheral circuit region 3. The amount QA of hydrogen per unit volume available from the element isolation portion 102 in the pixel circuit region 2 is proportional to the product of the hydrogen concentration CA and the area occupancy OA (QA∝CA×OA). Likewise, the amount QB of hydrogen per unit volume available from the element isolation portion 103 in the peripheral circuit region 3 is proportional to the product of the hydrogen concentration CB and the area occupancy OB (QB∝CB×OB). Thus, satisfying QB<QA means satisfying CB×OB<CA×OA. In order to satisfy both OA<OB and CB×OB<CA×OA, 10×CB≤CA can be satisfied. On the basis of CA×OA=DA and CB×OB=DB, whether QB<QA is satisfied can be judged by comparing the amounts of hydrogen measured by SIMS in the analysis regions 202 and 203 having the same shape.

<Method for Manufacturing Image Pickup Apparatus (First Embodiment)>

A method for manufacturing an image pickup apparatus IS according to a first embodiment will be described below with reference to FIGS. 5A to 5C and FIG. 6.

Figure 5A:
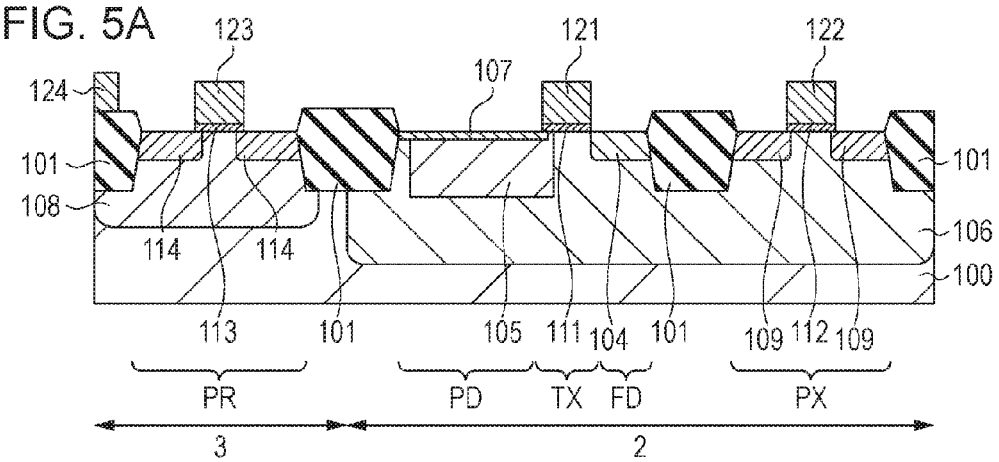
FIGS. 5A to 5C are schematic views illustrating a method for manufacturing an image pickup apparatus.

In a process a1 illustrated in FIG. 5A, first, an element isolation portion 101 is formed on a semiconductor layer 100 in a pixel circuit region 2 and a peripheral circuit region 3, for example, by a LOCOS method or a STI method. Impurity regions 106 and 108 are then formed as well regions. Gate-insulating films 111 and 112 of a pixel transistor PX and a gate-insulating film 113 of a peripheral transistor PR are then formed. The gate-insulating films 111, 112, and 113 can be converted into silicon oxide films containing nitrogen by thermal oxynitriding of the semiconductor layer 100 or by plasma nitriding of a silicon oxide film formed by thermal oxidation of the semiconductor layer 100. Then, a gate electrode 121 is formed on the gate-insulating film 111, a gate electrode 122 made of polysilicon is formed on the gate-insulating film 112, and a gate electrode 123 is formed on the gate-insulating film 113. The gate electrodes 121 and 122 may contain an n-type impurity, such as phosphorus. The gate electrodes 121 and 123 may contain a p-type impurity, such as boron. An electrical resistance 124 made of polysilicon is formed. Impurity regions 104, 105, 109, 107, and 114 are then formed.

Figure 5B:
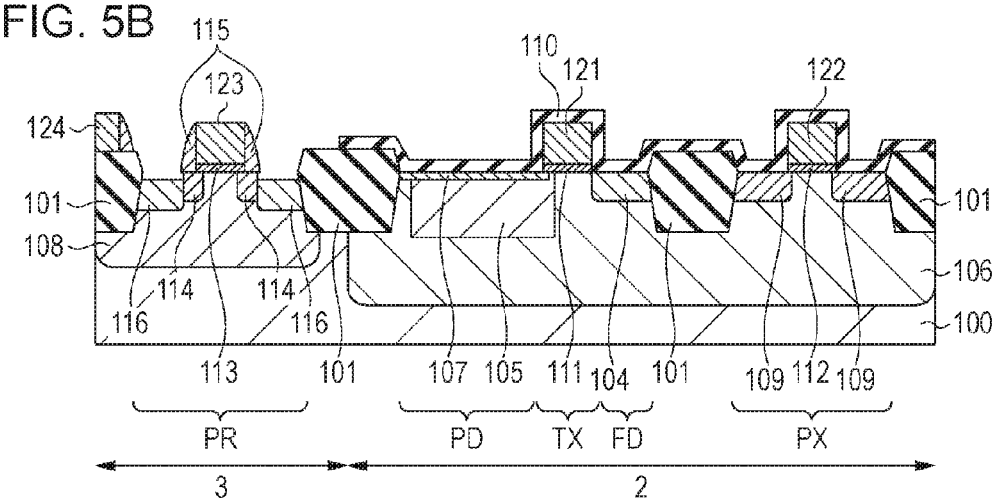

In a process b1 illustrated in FIG. 5B, first, the semiconductor layer 100 in the pixel circuit region 2 and the peripheral circuit region 3 is covered with a dielectric film. The dielectric film formed in the process b1 is a silicon nitride monolayer film or a multilayer film including a silicon nitride layer and a silicon oxide layer. While a portion of the dielectric film in the pixel circuit region 2 is covered with a resist mask (not shown), a portion of the dielectric film in the peripheral circuit region 3 is etched. Thus, a sidewall spacer 115 is formed on the side walls of the gate electrode 123. An impurity region 116 is formed in the source/drain of the peripheral transistor PR using the sidewall spacer 115 as part of a mask. The high-concentration impurity region 116 and the low-concentration impurity region 114 can constitute a lightly doped drain (LDD) structure in the source/drain of the peripheral transistor PR. An impurity region is formed in the semiconductor layer 100 by ion implantation and is activated by heat treatment at a temperature in the range of approximately 800° C. to 1100° C.

The unetched portion of the dielectric film in the pixel circuit region 2 is a silicon nitride layer 110. The silicon nitride layer 110 can function as a protective layer for protecting the pixel circuit region 2 from metal contamination or plasma damage and thereby reduce the number of white defects. The silicon nitride layer 110 more greatly restricts hydrogen diffusion than the silicon oxide layer. Thus, the silicon nitride layer 110 can function as a hydrogen shielding member, which restricts hydrogen supply, when hydrogen is supplied to the semiconductor layer 100 from above during heat treatment in a downstream process. During the formation of the dielectric film for the silicon nitride layer 110, the silicon nitride layer can be formed by plasma chemical vapor deposition (CVD) so as to dope the silicon nitride layer with hydrogen. In such a case, the silicon nitride layer 110 can also function as a hydrogen-containing member.

Figure 5C:
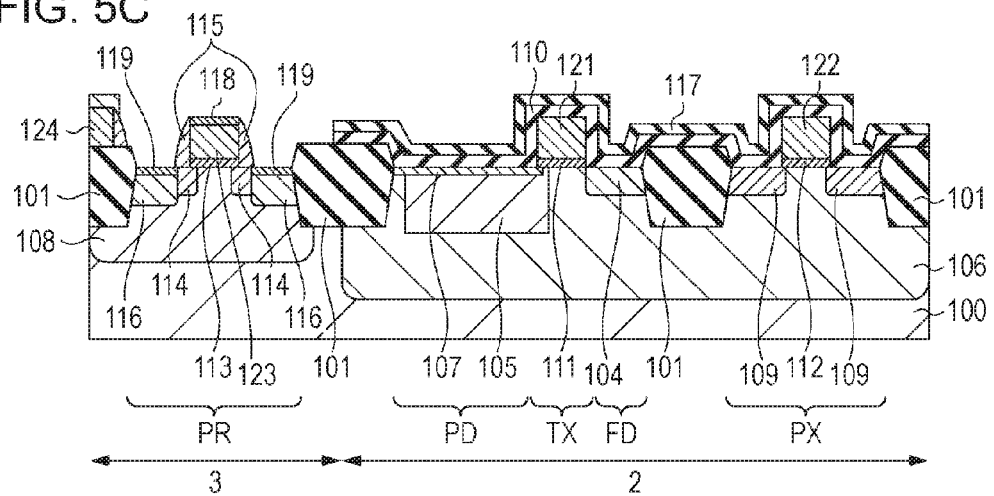

In a process c1 illustrated in FIG. 5C, first, the semiconductor layer 100 in the pixel circuit region 2 and the peripheral circuit region 3 is covered with an insulator film. The insulator film formed in the process c1 is a silicon oxide monolayer film or a multilayer film including a silicon nitride layer and a silicon oxide layer. While a portion of the insulator film in the pixel circuit region 2 and a portion of the insulator film on the electrical resistance 124 are covered with a resist mask (not shown), a portion of the insulator film in the peripheral circuit region 3 is etched. Thus, an insulator film 117 is formed on the pixel circuit region 2 and the electrical resistance 124. The insulator film 117 does not cover the peripheral transistor PR. A metal film (not shown) covering the semiconductor layer 100 in the pixel circuit region 2 and the peripheral circuit region 3 is then formed on the insulator film 117. The material of the metal film can be cobalt, nickel, tungsten, molybdenum, tantalum, chromium, palladium, and/or platinum, typically, cobalt or nickel. A self-aligned silicide (salicide) process is then performed using the insulator film 117 for silicide protection. More specifically, a contact portion between the semiconductor layer 100 and the metal film is selectively silicidized by heat treatment. The heat treatment is performed at a temperature in the range of 400° C. to 600° C. in a first stage for forming monosilicide and at a temperature in the range of 700° C. to 1000° C. in a second stage for forming disilicide. Thus, silicide regions 118 and 119 formed of a silicide of a metal contained in the metal film are formed in the peripheral transistor PR. Typically, the silicide regions 118 and 119 are cobalt silicide regions or nickel silicide regions. The silicide region 118 does not have to be disposed on the gate electrode 123. The insulator film 117 covering the electrical resistance 124 can prevent a decrease in electrical resistance resulting from silicidation of the electrical resistance 124. Unreacted metals in the salicide process are removed from the insulator film 117.

The peripheral transistor PR in the peripheral circuit region 3 is then covered with a silicon nitride layer 120. The silicon nitride layer 120 does not cover the pixel transistor PX in the pixel circuit region 2. The semiconductor layer 100 in the pixel circuit region 2 and the peripheral circuit region 3 is then covered with an interlayer insulating film 129. The interlayer insulating film 129 can be a silicon oxide film doped with carbon, fluorine, boron, and/or phosphorus. The interlayer insulating film 129 is flattened by reflowing. The heat treatment temperature for the reflowing may range from 600° C. to 1000° C. In order to further improve flatness, the interlayer insulating film 129 is subjected to chemical mechanical polishing (CMP).

A contact hole is formed in the interlayer insulating film 129 in the pixel circuit region 2. In the formation of the contact hole, the silicon nitride layer 110 can function as an etching stopper. A contact plug 130 coupled to the semiconductor layer 100 or the gate electrode 121 or 122 is then formed in the contact hole. A contact hole is formed in the interlayer insulating film 129 in the peripheral circuit region 3. In the formation of the contact hole, the silicon nitride layer 120 can function as an etching stopper. A contact plug 131 coupled to the semiconductor layer 100 or the gate electrode 123 is then formed in the contact hole. The contact hole for the contact plug 130 and the contact hole for the contact plug 131 may be simultaneously or separately formed. The contact plug 130 and the contact plug 131 may be simultaneously or separately formed. Before the contact plug 130 is formed, the impurity region 125 may be formed by implanting an impurity into the well through a desired contact hole (ion implantation). This can stabilize contact resistance. In order to activate the impurity region 125, heat treatment may be performed at a temperature in the range of 600° C. to 900° C. Before the contact plug 130 is formed, the contact hole for the contact plug 130 may be washed with an acidic or alkaline solution, such as hydrofluoric acid or an ammonia hydrogen peroxide mixture. The contact hole can be washed after an impurity is implanted into the contact hole. This can reduce contamination of the semiconductor layer 100 with metals. After the contact plug 130 is formed, a portion of the semiconductor layer 100 in contact with the contact plug 130 may be silicidized by heat treatment at 600° C. or less so as to decrease contact resistance. In this case, a silicide region of tungsten or titanium contained in the contact plug 130 may be formed in the portion of the semiconductor layer 100 in contact with the contact plug 130.

Figure 6:
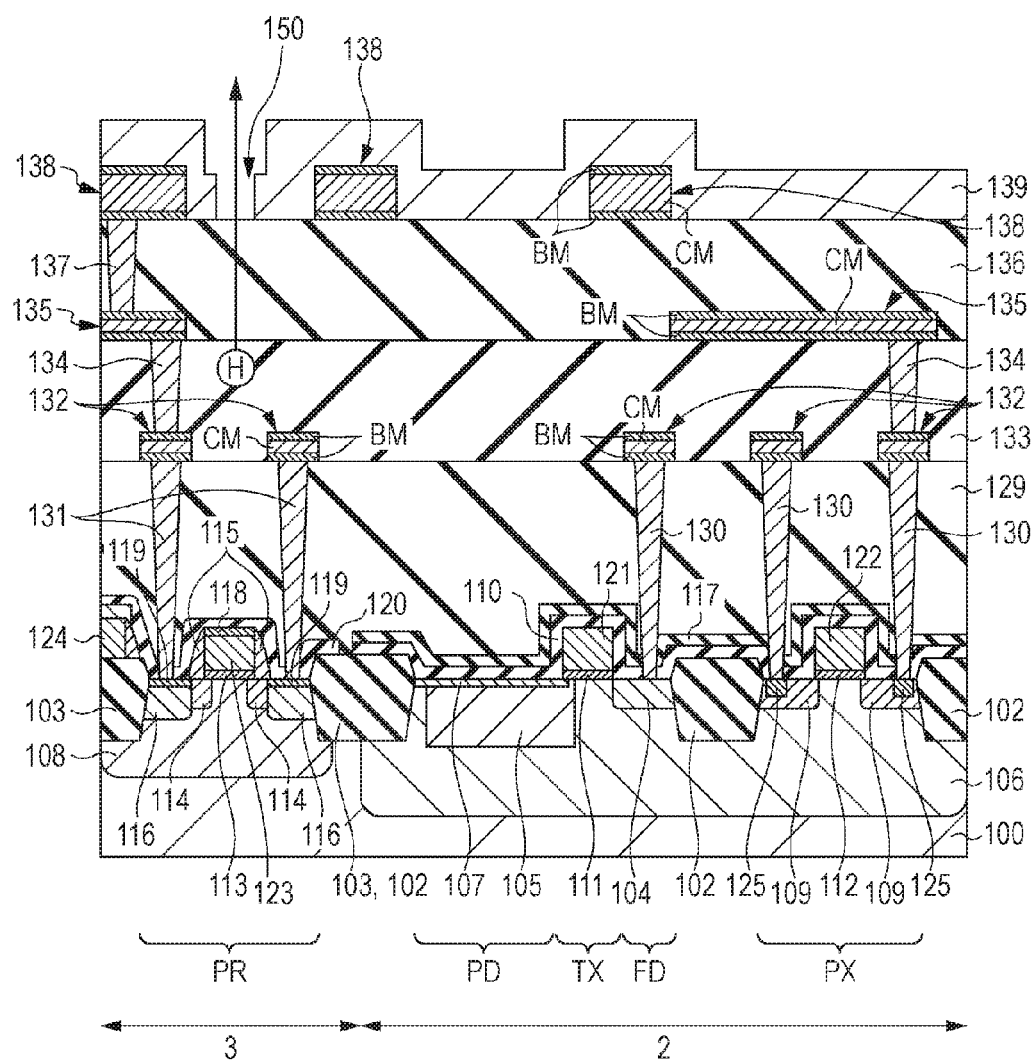
FIG. 6 is a schematic view illustrating a method for manufacturing an image pickup apparatus.

After that, the structure illustrated in FIG. 6 is formed. A conductive line 132 and an interlayer insulating film 133 are formed on the interlayer insulating film 129. A via plug 134 coupled to the conductive line 132 is formed in the interlayer insulating film 133. A conductive line 135 and an interlayer insulating film 136 are formed on the interlayer insulating film 133. A via plug 137 coupled to the conductive line 135 is formed in the interlayer insulating film 136. A conductive line 138 is formed on the interlayer insulating film 136. The interlayer insulating films 133 and 136 can be undoped silicon oxide films formed by plasma CVD. This can increase the hydrogen permeability of the interlayer insulating films 133 and 136.

When the hydrogen content of a silicon oxide layer in the interlayer insulating films 133 and 136 is increased, it is desirable that the silicon oxide layer be formed at a temperature as low as possible, in particular, at a temperature lower than the temperatures of the subsequent treatments (film formation, etching, and heating). The process gas for the silicon oxide film can be $SiH_4/O_2$ rather than tetraethyl orthosilicate (TEOS)/$O_2$. A process of forming such a silicon oxide film having an increased hydrogen content can be a low-temperature film formation process using high-density plasma CVD and a SiH$_4$/O$_2$ gas at a temperature in the range of approximately 300° C. to 400° C.

The conductive line 138 is covered with a passivation film 139. The passivation film 139 may be a monolayer film including a silicon nitride layer or a multilayer film including a silicon nitride layer and a silicon oxynitride layer for antireflection disposed on the top and/or bottom surface of the silicon nitride layer. In order to increase the hydrogen content of a silicon nitride layer in the passivation film 139, the silicon nitride layer can be formed by plasma CVD.

A portion of the passivation film 139 that does not overlap the closest conductive line 138 is removed by etching to form a hydrogen discharging hole 150. A portion of the passivation film 139 disposed on a pad electrode (PAD) for input to or output from the outside can also be etched to form a pad opening 155 (see FIG. 3B) simultaneously with the formation of the hydrogen discharging hole 150. The hydrogen discharging hole 150 and the pad opening 155 can be formed by applying a photoresist to the passivation film 139, patterning the photoresist in a predetermined pattern, and etching the passivation film 139 using the photoresist as a mask.

The structure in FIG. 6 thus formed is then subjected to heat treatment. The heat treatment allows hydrogen in the hydrogen-containing members, such as the passivation film 139 and the interlayer insulating films 133 and 136, to diffuse into the semiconductor layer 100. In order to increase the hydrogen supply from the interlayer insulating films 133 and 136, the heat treatment temperature can be higher than the film-forming temperatures of the hydrogen-containing members, such as the interlayer insulating films 133 and 136. Such heat treatment allows hydrogen remaining in the hydrogen-containing members after the film formation to desorb from the hydrogen-containing members and can thereby increase the amount of hydrogen supplied. The heat treatment temperature is preferably 350° C. or more, for example, in the range of 350° C. to 450° C. The heat treatment can be performed in an atmosphere of N$_2$, H$_2$, or a mixture thereof.

As illustrated in FIG. 3B, the hydrogen discharging hole 150 including a portion that does not overlap the closest conductive line 138 is disposed in the passivation film 139 in the peripheral circuit region 3. Thus, hydrogen diffusing from the passivation film 139 to the semiconductor layer 100 partly diffuses to the outside through the hydrogen discharging hole 150. Hydrogen from the hydrogen-containing members, such as the interlayer insulating films 133 and 136, also partly diffuses to the outside through the hydrogen discharging hole 150. Thus, the hydrogen discharging hole 150 reduces the amount of hydrogen supplied to the peripheral circuit region 3. Since the area occupancy of the passivation film 139 is higher in the pixel circuit region 2 than in the peripheral circuit region 3, the amount of hydrogen supplied from the passivation film 139 is higher in the pixel circuit region 2 than in the peripheral circuit region 3. Thus, the hydrogen discharging hole 150 in the passivation film 139 in the peripheral circuit region 3 can limit the amount of hydrogen supplied to the peripheral circuit region 3 and increase the amount of hydrogen supplied to the pixel circuit region 2. Thus, noise in the pixel circuit region 2 can be reduced while suppressing degradation of the hot carrier resistance of the peripheral circuit region 3 and reducing the NBTI of the peripheral circuit region 3.

In heat treatment for hydrogen supply and hydrogen discharge, it is desirable that the hydrogen discharging hole 150 have an empty space. Even if the hydrogen discharging hole 150 is filled with a hydrogen permeable member, such as a silicon oxide film, hydrogen discharge is possible. After hydrogen is discharged through the hydrogen discharging hole 150 by heat treatment, the hydrogen discharging hole 150 may be filled with a hydrogen shielding member, such as a silicon nitride film. In consideration of hydrogen diffusion during subsequent heat treatment, however, the hydrogen discharging hole 150 can have an empty space. It is also advantageous not to cover the hydrogen discharging hole 150 with a passivation member, such as a silicon nitride film, in order to increase the amount of gas other than hydrogen discharged through the hydrogen discharging hole 150 during use of the image pickup apparatus IS.

After the heat treatment for hydrogen supply, the planarizing film 140, the color filter 141, and the microlens 142 illustrated in FIG. 2 are formed on the passivation film 139. Alternatively, in the case of a backside illuminated image pickup apparatus, the semiconductor layer 100 is made thinner before or after the heat treatment for hydrogen supply, and the color filter and the microlens are formed on the back side of the semiconductor layer 100 opposite the front side on which the conductive line structure is disposed.

Method for Manufacturing Image Pickup Apparatus (Second Embodiment)

Figure 7:
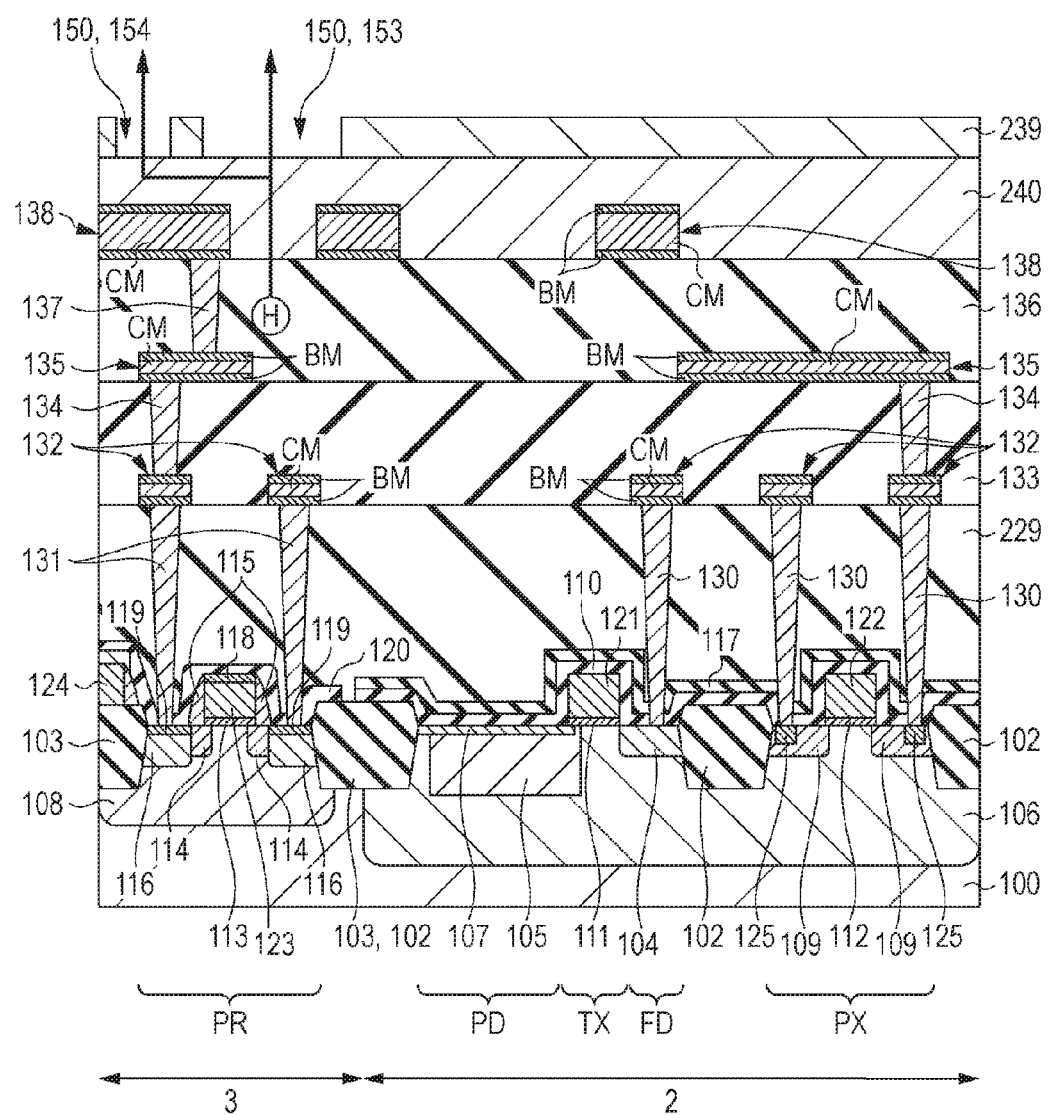
FIG. 7 is a schematic view illustrating a method for manufacturing an image pickup apparatus.

A method for manufacturing an image pickup apparatus IS according to a second embodiment will be described below with reference to FIG. 7. The present embodiment is different from the first embodiment in the form of the passivation film and hydrogen-containing member. The common components with the first embodiment will not be described again.

In the present embodiment, the structure illustrated in FIG. 5C is formed in the same manner as in the first embodiment. In the present embodiment, the hydrogen content of an interlayer insulating film 229 that the contact plugs 130 and 131 penetrate is increased by a low-temperature film formation process. The low-temperature film formation process involves high-density plasma CVD using a SiH$_4$/O$_2$ gas at a temperature in the range of approximately 300° C. to 400° C.

After the interlayer insulating film 229 is formed, the processes up to the formation of the closest conductive line 138 are performed in the same manner as in the first embodiment. A planarizing film 240 is then formed on the closest conductive line 138. The planarizing film 240 is an insulating film, such as a silicon oxide film, and extends from the pixel circuit region 2 to the peripheral circuit region 3. After the insulating film is formed on the closest conductive line 138, the planarizing film 240 is formed by flattening the insulating film by CMP or an etch-back method. The planarizing film 240 may be a hydrogen-containing member. In this case, a silicon oxide film used as the planarizing film 240 is subjected to a low-temperature film formation process involving high-density plasma CVD using a SiH$_4$/O$_2$ gas at a temperature in the range of approximately 300° C. to 400° C.

A passivation film 239 is then formed on the planarizing film 240. In the same manner as in the first embodiment, the passivation film 239 can be a monolayer film of a silicon nitride layer or silicon oxynitride layer or a multilayer film including a silicon nitride layer and a silicon oxynitride layer. The planarizing film 240 under the passivation film 239 can reduce scattering of light on the passivation film 239 and increase light-use efficiency.

The hydrogen discharging hole 150 can be formed in the passivation film 239 in the same manner as in the first embodiment. Thus, the structure illustrated in FIG. 7 is prepared. The structure is subjected to heat treatment. The heat treatment temperature is preferably 350° C. or more, for example, in the range of 350° C. to 450° C. The heat treatment can be performed in an atmosphere of $N_2$, $H_2$, or a mixture thereof.

In the present embodiment, the fourth type through-hole 154 illustrated in FIG. 3 can function as the hydrogen discharging hole 150. Hydrogen between the closest conductive lines 138 is discharged from the hydrogen discharging hole 150 through the planarizing film 240 between the closest conductive lines 138 and the passivation film 239. Even when the hydrogen discharging hole 150 includes a portion that overlaps the closest conductive line 138 as in the third type through-hole 153 illustrated in FIG. 3, the planarizing film 240 can cover and protect the closest conductive line 138. For the same reason, the planarizing film 240 allows the second type through-hole 152 having a larger pattern than the closest conductive line 138 to be suitably used.

These embodiments may be modified without departing from the idea of the present technique.

The present technique can improve the characteristics of the peripheral circuit region.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-101336 filed May 18, 2015, which is hereby incorporated by reference herein in its entirety.

What is claimed is:

1. An image pickup apparatus including a pixel circuit region and a peripheral circuit region, comprising:
a semiconductor layer constituting the pixel circuit region and the peripheral circuit region;
a passivation film disposed above the semiconductor layer and extending from the pixel circuit region to the peripheral circuit region;
a member disposed between the semiconductor layer and the passivation film in the peripheral circuit region; and
a plurality of conductive lines disposed between the semiconductor layer and the passivation film,
wherein at least one of the passivation film and the member contains hydrogen,
the passivation film in the peripheral circuit region has a portion overlapping one conductive line of the plurality of conductive lines in a direction perpendicular to a main surface of the semiconductor layer, the one conductive line being closest to the passivation film among the plurality of conductive lines, and
the passivation film in the peripheral circuit region has a through-hole, the through-hole including a portion not overlapping the one conductive line in the direction perpendicular to the main surface of the semiconductor layer,
wherein a photodiode in the pixel circuit region is arranged in the semiconductor layer, and a transistor in the peripheral circuit region is arranged on the semiconductor layer, and
wherein all of the plurality of conductive lines in the pixel circuit region overlaps the passivation film in the direction perpendicular to the main surface of the semiconductor layer.

2. The image pickup apparatus according to claim 1, wherein element isolation portion in the peripheral circuit region has a lower hydrogen concentration than the element isolation portion in the pixel circuit region.

3. The image pickup apparatus according to claim 1, wherein the member includes a silicon oxide layer, the passivation film includes a silicon nitride layer, the one conductive line includes a plurality of layers, and of the layers of the one conductive line, a layer closest to the passivation film is a titanium nitride layer.

4. The image pickup apparatus according to claim 1, wherein a signal processing unit and an output unit are disposed in the peripheral circuit region, and the through-hole overlaps at least one of the signal processing unit and the output unit in the direction perpendicular to the main surface of the semiconductor layer.

5. The image pickup apparatus according to claim 1, wherein the through-hole includes a portion that overlaps the one conductive line in the direction perpendicular to the main surface of the semiconductor layer.

6. The image pickup apparatus according to claim 5, wherein an edge of the through-hole does not overlap the one conductive line in the direction perpendicular to the main surface of the semiconductor layer.

7. The image pickup apparatus according to claim 5, wherein an edge of the through-hole overlaps the one conductive line in the direction perpendicular to the main surface of the semiconductor layer.

8. The image pickup apparatus according to claim 1, wherein the through-hole does not overlap the one conductive line in the direction perpendicular to the main surface of the semiconductor layer.

9. The image pickup apparatus according to claim 1, wherein the passivation film in the peripheral circuit region has a second through-hole, the second through-hole includes a portion not overlapping the one conductive line in the direction perpendicular to the main surface of the semiconductor layer.

10. The image pickup apparatus according to claim 1, further comprising:
a planarizing film disposed on the passivation film; and
a color filter disposed directly on the planarizing film,
wherein the planarizing film has a portion arranged in the through-hole of the passivation film.

11. An image pickup apparatus including a pixel circuit region and a peripheral circuit region, comprising:
a semiconductor layer constituting the pixel circuit region and the peripheral circuit region;
a passivation film disposed above the semiconductor layer and extending from the pixel circuit region to the peripheral circuit region;
a member disposed between the semiconductor layer and the passivation film in the peripheral circuit region; and
a plurality of conductive lines disposed between the semiconductor layer and the passivation film,
wherein at least one of the passivation film and the member contains hydrogen,
the passivation film in the peripheral circuit region has a portion overlapping one conductive line of the plurality of conductive lines in a direction perpendicular to a main surface of the semiconductor layer, the one conductive line being closest to the passivation film among the plurality of conductive lines, and
the passivation film in the peripheral circuit region has a through-hole, the through-hole including a portion not overlapping the one conductive line in the direction perpendicular to the main surface of the semiconductor layer, wherein the passivation film in the peripheral circuit region has a second through-hole, the second through-hole includes a portion that does not overlap the one conductive line in the direction perpendicular to the main surface of the semiconductor layer and a portion that overlaps the one conductive line in the direction perpendicular to the main surface of the semiconductor layer, wherein the passivation film in the peripheral circuit region has a third through-hole, the third through-hole includes a portion that does not overlap the one conductive line in the direction perpendicular to the main surface of the semiconductor layer and a portion that overlaps the one conductive line in the direction perpendicular to the main surface of the semiconductor layer, wherein the second through-hole has an edge that does not overlap the one conductive line in the direction perpendicular to the main surface of the semiconductor layer, and wherein the third through-hole has an edge that overlaps the one conductive line in the direction perpendicular to the main surface of the semiconductor layer.

12. An image pickup apparatus including a pixel circuit region and a peripheral circuit region, comprising:
a semiconductor layer constituting the pixel circuit region and the peripheral circuit region;
a passivation film disposed above the semiconductor layer and extending from the pixel circuit region to the peripheral circuit region;
a planarizing film disposed on the passivation film;
a color filter disposed directly on the planarizing film;
a member disposed between the semiconductor layer and the passivation film in the peripheral circuit region; and
a plurality of conductive lines disposed between the semiconductor layer and the passivation film,
wherein at least one of the passivation film and the member contains hydrogen,
the passivation film in the peripheral circuit region has a portion overlapping one conductive line of the plurality of conductive lines in a direction perpendicular to a main surface of the semiconductor layer, the one conductive line being closest to the passivation film among the plurality of conductive lines, and
the passivation film in the peripheral circuit region has a through-hole, the through-hole including a portion not overlapping the one conductive line in the direction perpendicular to the main surface of the semiconductor layer,
wherein the passivation film in the peripheral circuit region has a pad opening, the pad opening includes a portion that overlaps the one conductive line in the direction perpendicular to the main surface of the semiconductor layer, and wherein the planarizing film has a portion arranged in the through-hole of the passivation film.

13. The image pickup apparatus according to claim 12, wherein the member contains hydrogen and is an insulating film extending from the pixel circuit region to the peripheral circuit region.

14. The image pickup apparatus according to claim 13, wherein the insulating film is disposed between a first conductive line and a second conductive line of the plurality of conductive lines.

15. The image pickup apparatus according to claim 13, wherein the insulating film is disposed between the one conductive line and the passivation film.

16. The image pickup apparatus according to claim 12,
wherein the passivation film in the peripheral circuit region has a second through-hole, the second through-hole includes a portion that does not overlap the one conductive line in the direction perpendicular to the main surface of the semiconductor layer and a portion that overlaps the one conductive line in the direction perpendicular to the main surface of the semiconductor layer, and
wherein the passivation film in the peripheral circuit region has a third through-hole, the third through-hole includes a portion that does not overlap the one conductive line in the direction perpendicular to the main surface of the semiconductor layer and a portion that overlaps the one conductive line in the direction perpendicular to the main surface of the semiconductor layer.

17. The image pickup apparatus according to claim 12, wherein the passivation film is disposed on an entirety of the pixel circuit region.

18. The image pickup apparatus according to claim 12, wherein all of the plurality of conductive lines in the pixel circuit region overlaps the passivation film in the direction perpendicular to the main surface of the semiconductor layer.

19. The image pickup apparatus according to claim 12, wherein the semiconductor layer has a photoelectric conversion unit in the pixel circuit region, and the semiconductor layer has a transistor in the peripheral circuit region.

20. The image pickup apparatus according to claim 12, further comprising:
a microlens disposed on the passivation film,
wherein a conductor is not disposed between the microlens and the passivation film.

* * * * *